(12) United States Patent
Beier et al.

(10) Patent No.: US 6,798,438 B2
(45) Date of Patent: Sep. 28, 2004

(54) IMAGE-RECORDING DEVICE FOR A PRINTING FORM, HAVING AN ARRAY OF VCSEL LIGHT SOURCES

(75) Inventors: Bernard Beier, Ladenburg (DE); Bernd Vosseler, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 239 days.

(21) Appl. No.: 10/072,590

(22) Filed: Feb. 6, 2002

(65) Prior Publication Data

US 2002/0129723 A1 Sep. 19, 2002

(30) Foreign Application Priority Data

Mar. 13, 2001 (DE) .......................................... 101 11 871

(51) Int. Cl.[7] .................................................. B41J 2/45
(52) U.S. Cl. ...................................................... 347/238
(58) Field of Search ................................ 347/238, 241, 347/242, 130

(56) References Cited

U.S. PATENT DOCUMENTS

| | | | |
|---|---|---|---|
| 4,677,629 A | 6/1987 | Lesh | 372/18 |
| 4,900,130 A | 2/1990 | Haas | 350/321 |
| 5,291,329 A | 3/1994 | Wakimoto et al. | 359/362 |
| 5,465,265 A | 11/1995 | Ota | 372/101 |
| 5,477,259 A | 12/1995 | Iwasa | 347/238 |
| 5,761,229 A | 6/1998 | Baldwin et al. | 372/31 |
| 5,793,783 A | 8/1998 | Endriz | 372/31 |
| 5,838,715 A | 11/1998 | Corzine et al. | 372/96 |
| 5,995,475 A | 11/1999 | Gelbart | 369/112 |
| 6,318,264 B1 | 11/2001 | D'Heureuse et al. | 101/467 |
| 6,353,502 B1 * | 3/2002 | Marchant et al. | 359/626 |

FOREIGN PATENT DOCUMENTS

| | | |
|---|---|---|
| DE | 19602307 | 7/1997 |
| DE | 19739409 | 3/1999 |
| EP | 0905835 | 3/1999 |
| JP | 2000043317 | 2/2000 |

* cited by examiner

*Primary Examiner*—Huan Tran
(74) *Attorney, Agent, or Firm*—Davidson, Davidson & Kappel, LLC

(57) ABSTRACT

A device for recording images on a printing form, including an array of light sources and imaging optics for generating (n×m) imaging spots on a printing form, which is distinguished by the array of light sources including an array of mutually independently controllable VCSEL light sources. One specific imaging spot may be formed on the printing form by combining the light emitted by a subarray of the VCSEL light sources. Due to the advantageous beam properties of VCSEL light sources, such as the small divergence and negligible astigmatism, the device for recording images on printing forms is especially advantageous for use in a printing-form imaging unit or in a print unit.

19 Claims, 6 Drawing Sheets

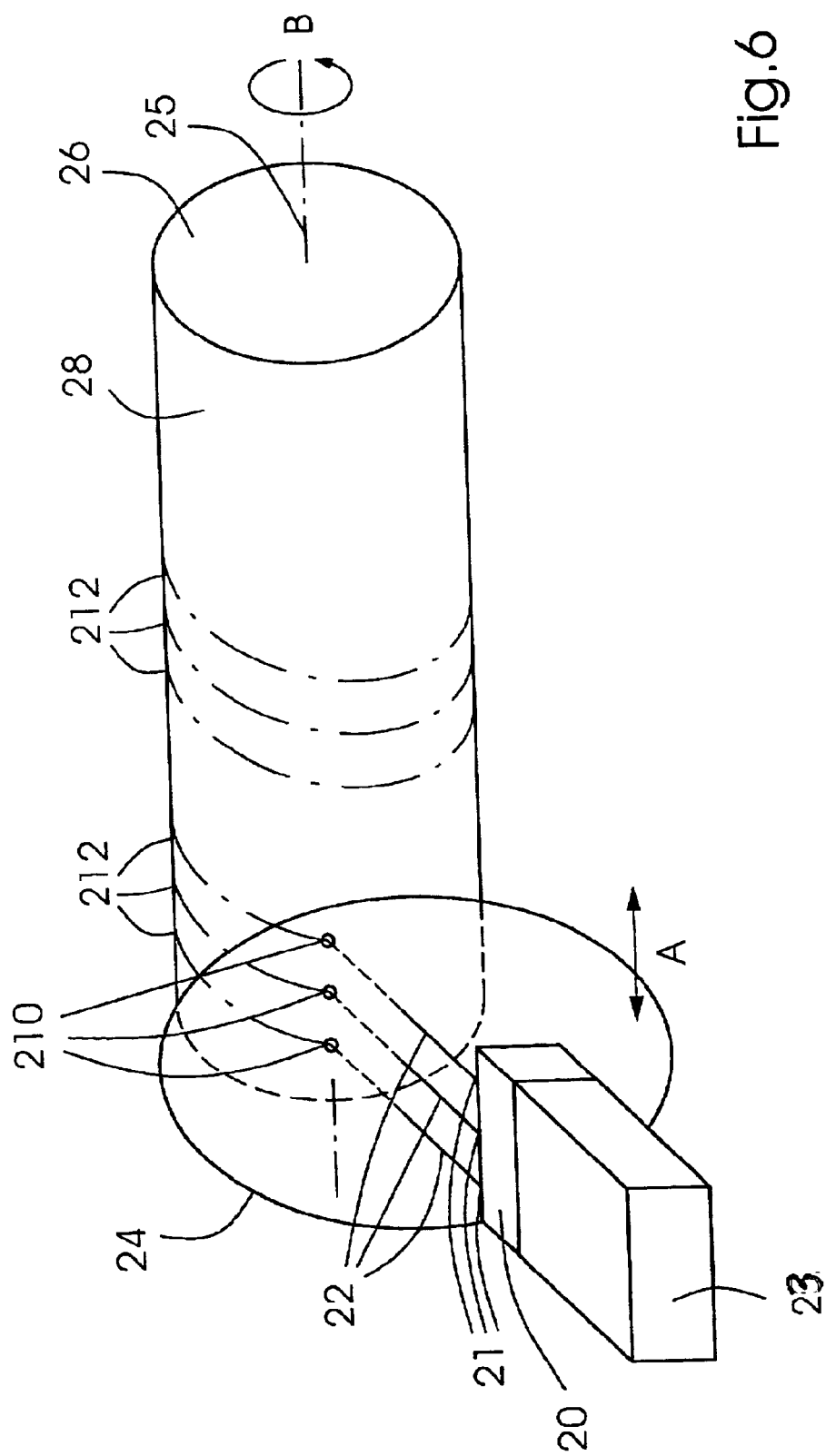

IMAGE-RECORDING DEVICE FOR A PRINTING FORM, HAVING AN ARRAY OF VCSEL LIGHT SOURCES

Priority to German Application No. 101 11 871.6, filed Mar. 13, 2001 and hereby incorporated by reference herein, is claimed.

BACKGROUND INFORMATION

The present invention is directed to a device for recording images on a printing form, including an array of light sources and imaging optics for generating (n×m) imaging spots on the printing form, n>1 and m>=1 being natural numbers.

The time it takes to record an image on printing forms, whether it is in a printing-form imaging unit or in a print unit, is substantially determined by the number of available imaging channels. For that reason, typical image-recording devices have a plurality of light sources, at least one light source being assigned to an imaging channel. By way of an image-recording channel, an imaging spot is projected onto the surface of a printing form, enabling printing dots to be placed on the printing form. Many documents in the technical literature deal with the multi-beam image-recording of printing forms.

U.S. Pat. No. 5,291,329, for example, describes a device for recording images, where a plurality of laser light sources configured in a two-dimensional array are imaged using an optical system onto a recording surface to generate a plurality of imaging spots. The laser light sources are typically configured on a spherical-shell sector such that the main beam of any one laser passes through a focus of a first lens of the optical system.

To reduce the pitch of imaging spots, U.S. Pat. No. 5,995,475 discusses a two-dimensional array of individual multimode laser diodes having separate collimating lenses. The array is imaged at a large reduction ratio onto a recording medium. In this instance, the imaging optics includes anamorphic, optical elements to form the beam of the divergent laser light.

What these image-recording devices have in common is that they use edge-emitting diode lasers to generate the laser radiation. A disadvantageous property of edge-emitting diode lasers is, however, that they exhibit laser radiation having a large angle of divergence and a pronounced astigmatism, making for a complex focusing of the laser radiation and usually requiring an expensive optical lens system. Moreover, edge-emitting diode lasers must first be broken out of a wafer and mounted, prior to performing a functional test. These manufacturing steps are, in part, very expensive; they reduce manufacturing efficiency, and, as a result, increase the price of the lasers.

While conventional semiconductor lasers are edge emitters, thus the light is propagated perpendicularly to the surface of the p-n junction, and the light emerges perpendicularly from the cleavage faces of the chip, so-called surface-emitting laser diodes (VCSEL laser diodes, vertical-cavity surface-emitting lasers) are known, which emit light perpendicularly to the wafer surface. The cavity resonator axis is disposed in parallel to the surface of the p-n junction. In the context of this description and of the device according to the present invention, the concept of a VCSEL light source may embrace all diode lasers, whose beam direction is at right angles to the active zone. These may be, in particular, surface emitters, whose resonator cavity length is short in comparison to the thickness of the active zone, surface emitters, whose resonator cavities are monolithically lengthened, or surface emitters, which have an external or a coupled resonator cavity (also referred to as NECSELs). Furthermore, a VCSEL light source may be a diode laser, whose resonator cavity is situated essentially in parallel to the active zone and is provided with a diffracting or reflecting structure which couples out the laser radiation at right angles to the active zone.

Generally, for VCSEL light sources, it holds that the active length of the resonator can be very short, typically only a few micrometers, and that highly reflecting resonator cavity mirrors are needed to obtain small threshold currents. Surface-emitting laser diodes, VCSEL light sources, have numerous interesting properties. By employing an extremely short resonator cavity, often of a length of less than ten micrometers, one achieves a large longitudinal mode spacing, which promotes single-mode emission above the laser threshold. By using a rotationally symmetric resonator cavity of, typically, six to eight micrometers diameter, one obtains a circular near field and—due to the relatively large diameter—a small beam divergence. Moreover, the geometry of the laser permits a simple monolithic integration of two-dimensional VCSEL laser-diode arrays. Finally, it is possible to test the lasers directly on the wafer following manufacturing.

The typical layer structure of a surface-emitting laser is known to one skilled in the art and can be taken from the relevant literature (see, for example, K. J. Ebeling "Integrierte Optoelektronik" [Integrated Opto-electronics], Springer Publishers, Berlin, 1992). EP Pat. 090 5 835 A1, for example, describes a two-dimensional array of VCSEL light sources which are individually addressable or controllable.

Typical VCSEL light sources have, however, only a modest output power. To increase the attainable output power and to restrict a laser to oscillate in its fundamental mode, U.S. Pat. No. 5,838,715 describes a special resonator cavity form for a VCSEL layer structure. However, the drawback of a procedure of this kind is, inter alia, the expensive manufacturing.

In this connection, it is worth mentioning that it is also known from the literature that light from a plurality of emitter diodes is combined to generate an intensive light beam using imaging optics. For example, U.S. Pat. 5,793,783 describes how light from a plurality of light sources or subarrays of light sources in one array is converged into an overlapping focus.

In addition, it is established from the literature, for example, from U.S. Pat. No. 5,477,259, that an array of light sources can be combined from individual modules of subarrays. Typically, this constitutes a row, thus, one-dimensionally configured laser diodes, which are fixed side-by-side on a mounting element, resulting in a two-dimensional array of light sources.

There are usually two classes of image-recording methods for recording images on a printing form using a one- or two-dimensional array of imaging spots. The first class is based on a dense arrangement of imaging spots of the image-recording light sources. In other words: The spacing among the image-recording points corresponds to the spacing among the printing dots to be set. The two-dimensional printing form to be recorded on is then covered in a translatory movement in the two linearly independent directions defining the surface. The second class of image-recording methods is distinguished by the spacing among the imaging spots being greater than the spacing among the adjacent printing dots to be set. Therefore, a complete recording of images on the two-dimensional printing form requires that the imaging spots of one specific imaging step come to rest between imaging spots of an imaging step that preceded in time. Methods of this kind are also called interleaving methods. U.S. Pat. No. 4,900,130 is cited here as an example of such an interleaving method. This document discusses both a one-dimensional as well as a two-dimensional method for interleaving raster scan lines for a one- and/or two-dimensional array of light sources, whose imaging spots are situated on a recording medium at a larger spatial interval than adjacent printing dots.

SUMMARY OF THE INVENTION

An object of the present invention is, therefore, to create a device for recording images on a printing form which is able to record using a multiplicity of image-recording channels and whose light exhibits advantageous beam properties, and/or whose focal points are able to be generated using simple optics. It is additionally or alternatively intended to achieve a long system service life and to render possible inexpensive repairs, in the event of partial failures.

The present invention provides a device for recording images on a printing form (16), including an array (10) of light sources (12) and an imaging optics (14) for generating (n×m) imaging spots (18) on the printing form (16), n>1 and m>=1 being natural numbers. The array (10) of light sources (12) includes an array of (r×s) VCSEL light sources (12), of which at least two VCSEL light sources (12) are controllable independently of one another, r>=n and s>=m being natural numbers.

The device according to the present invention for recording images on a printing form thus has an array of light sources and imaging optics for generating (n×m) imaging spots on the printing form, n>1 and m>=1 being natural numbers. A distinguishing feature of the device is that the array of light sources includes an array of (r×s) VCSEL light sources, of which at least two VCSEL light sources are controllable independently of one another, r>=n and s>=m and r and s being natural numbers. Surface-emitting diode lasers (VCSEL) have advantageous beam properties. Because of the extended emitter surface, the radiation is emitted at a small angle of divergence. The beam quality and the shape of the emitted beam are substantially determined by the size of the outcoupling facet. Through selection of a specific size, a VCSEL generates radiation in the fundamental mode of the resonator cavity (Gaussian beam), which is especially advantageous for recording images on a printing plate due to the substantial depth of focus. In contrast to edge-emitting lasers, beam diameters and divergence angles are the same in the linearly independent directions defining the beam diameter, so that a collimation and a focusing may be achieved using relatively simple optical elements (fewer asymmetrical and/or aspherical elements), in the form of micro-lens arrays as well. A suitable contacting of the individual VCSELs in the array ensures that the individual lasers are able to be controlled separately and independently of one another, making it possible to vary the light intensity in the image-recording channels assigned to the VCSEL light sources.

In other words, an important idea of the present invention is to employ a VCSEL array to record images on printing forms, where, for each image-recording channel, a high enough power output is generated by VCSEL emitters in an advantageous resonator mode. Using an individually controllable array, in each image-recording channel, an intensity corresponding to the image-recording information may be impressed on the imaging spot. To attain a higher power output for each image-recording channel, it may be advantageous to excite other modes, apart from the fundamental mode of the resonator cavity.

In particular, to increase the available power, the device for recording images on a printing form may be designed such that at least one imaging spot is formed on the printing form by combining the light emitted by a subarray of the (r×s) VCSEL light sources, thus, at least two VCSEL light sources. By allocating in this manner a plurality of VCSEL light is sources to one image-recording channel, one advantageously increases the redundancy and the system service life, at the same time. Should one VCSEL light source fail, others are still available within the image-recording channel.

It is especially beneficial to provide the device for recording images on a printing form with an array of VCSEL light sources which is constructed in modular fashion from a number of subarrays. In other words, the total array of the (r×s) VCSEL light sources may be fabricated from individual strips or blocks, each including a plurality of VCSEL light sources, for example s blocks having r surface emitters. In the event of a partial failure of certain light sources, these may be replaced quickly, simply, and inexpensively.

In one alternative specific embodiment of the device according to the present invention, which produces oval foci on a printing form, preferably with an ellipticity of at least 1%, whether it be due to an elliptical geometry of the surface emitters or due to suitable optics, a higher energy density may be achieved in relation to the moving direction using a transverse-elliptical (oblate) beam and a more favorable coupling of the energy into the printing form using a longitudinal-elliptical (prolate) beam than when a round beam is employed, which generates the same line width.

VCSEL arrays count among their properties that the substrate edges are exposed and do not perform the function of emitting facets as in the case of edge-emitting diode lasers. This makes it possible to process the edges very precisely, enabling individual arrays to be positioned relatively to one another. As a result, a plurality of one- or two-dimensional VCSEL-arrays may be positioned with respect to a larger array, thus subarrays may be positioned with respect to an (r×s) array of VCSEL light sources, where the regularity of the geometric arrangement of the emitters extends over the entire array. Therefore, a modular-type construction makes it possible to achieve very large arrays, a failure of individual emitters on one module being easily rectified by replacing only the affected module.

An efficient cooling is rendered possible when, in one advantageous specific embodiment of the device of the present invention for recording images, the VCSEL is mounted with the p-side facing downwards (on a carrier or a holding element).

By configuring the VCSEL light sources two-dimensionally, one obtains a lower thermal resistance than in the case of an array of edge-emitting diode lasers, due to a more homogeneous, approximately one-dimensional heat flow. In the case of edge-emitting diode lasers, the contact surface between regions, in which heat is produced, and the heat sink(s) typically amounts to 0.1 $cm^2$; in the case of a VCSEL array, however, typically to 1.0 $cm^2$.

In this connection, it should be mentioned that, in contrast to edge-emitting diode lasers, VCSELs exhibit a quite readily reproducible ageing behavior. Spontaneous failures, for example due to facet destruction, are relatively rare. This signifies a prolonged overall service life for the VCSEL arrays, since, in all probability, no emitters fail until after an extended period of time; this contrasts to the facet destruction of an edge emitter, which occurs approximately at a specific rate, regardless of ageing. The reproducible ageing may advantageously be utilized in that the power of a reference emitter is measured, so that the power loss caused by ageing of the reference emitter and of an assigned group of emitters may be compensated without having to determine or measure the power of each individual emitter.

Besides the mentioned scalability of a preferably individually controllable VCSEL array, it is significant that the inherent system properties of VCSEL arrays facilitate a device which is more cost-effective than a device which utilizes edge-emitting laser diodes. Moreover, the geometric dimensions of a VCSEL array are considerably smaller, so that a very compact image-recording device may be created for printing forms.

By incoherently focusing the light from at least two VCSEL light source in an image-recording channel, at the same point, the VCSEL light sources in the subarray assigned to the image-recording channel may be beneficially controlled such that the light emitted by a VCSEL light source exhibits a fixed phase relation to the light emitted by a second VCSEL light source. Utilizing constructive interference effects, a beam may be formed which possesses a high power output, in connection with a high beam quality. Therefore, in this case, producing a specific imaging spot requires driving the VCSEL light sources in question simultaneously. In other words, a plurality of emitters, thus VCSEL light sources, are combined into one image-recording channel.

The device according to the present invention for recording images on a printing form maybe utilized to special advantage in a printing-form imaging unit or in a print unit. In this context, it may concern both flat-bed imaging units as well as printing forms accommodated on curved holding elements, for example on a cylinder. The two-dimensional surface of the printing form is swept over by the imaging spots of the device for recording images, in a fast and slow feed direction (linearly independent directions, not necessarily at right angles to one another). A printing press in accordance with the present invention, which includes at least one feeder, a print unit, and a delivery unit (sheet-fed press), has at least one print unit including a device according to the present invention for recording images on a printing form. Alternatively thereto, a web-processing printing press may also have a device according to the present invention. The printing press is preferably a direct or indirect flat-bed printing press, in particular an offset press.

In this context, a two-dimensional configuration of the array may advantageously be such that the r columns (having s VCSEL light sources) are disposed substantially perpendicularly to the fast feed direction, thus the s lines of the array are disposed essentially perpendicularly to the slow feed direction. When q is the distance between two adjacent surface emitters, and d is the distance between two lines on the printing form, then, preferably, $s=q/d$. To produce x-times redundancy, preferably $s=x*q/d$. A low sensitivity to tilting of the array and time-related control errors may be achieved by a geometric configuration, in which the maximum distance, in the fast feed direction, between two VCSEL light sources, which record adjacent lines, is less than $s*q$.

By using a very large array, i.e., one that is modularly assembled out of subarrays, a 1:1 image recording is possible. In other words, the entire surface of the printing form on which images of a specific number of printing dots are to be recorded is exposed using the same number of image-recording channels. This may be beneficial, particularly when working with flat-bed exposure, when the aim is to achieve a very fast printing form imaging unit. Due to the advantageous beam properties of VCSEL light sources, a relatively simple imaging optics may be used, or, however, in the case of a very small image-recording distance, a direct image recording may take place without imaging optics.

It is worth mentioning that the printing form may be both a conventional printing form, thus, for example, a customary thermal printing form, as well as a re-recordable printing form, a printing master or a film. When working with a digitally recordable printing form, whose sensitivity to a specific wavelength of the image-recording light becomes extreme, VCSEL light sources having corresponding emission wavelengths must be used. In certain applications, it may be advantageous not to use the VCSEL light sources in the continuous wave mode, thus for emitting continuous radiation, but rather for generating short pulsed radiation.

BRIEF DESCRIPTION OF THE DRAWINGS

Other advantages and beneficial specific embodiments of the present invention are presented on the basis of the subsequent figures and descriptions thereof, in which:

FIG. 6 shows a schematic representation of the use of device according to the present invention, including a printing form accommodated on a cylinder.

DETAILED DESCRIPTION

Figure 1:
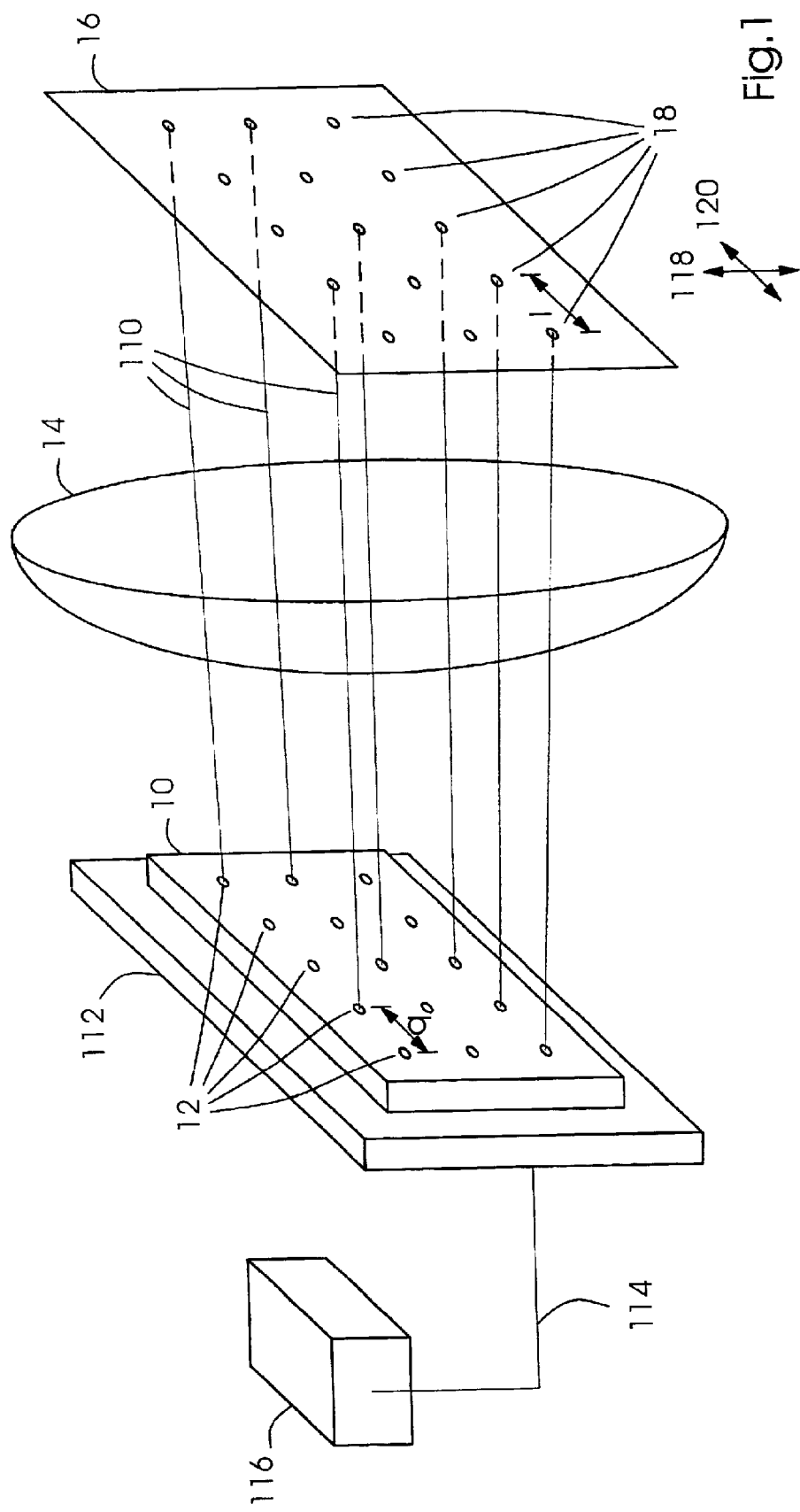
FIG. 1 shows a schematic representation of a device according to the present invention for recording images on a printing form, including an array of VCSEL light sources and an imaging optics for generating imaging spots on the printing form.

FIG. 1 shows a schematic representation of a device according to the present invention for recording images on a printing form, including an array 10 of VCSEL light sources 12 and an imaging optics 14 for generating imaging spots on the printing form. The array of light sources 10 has individual emitters, which include VCSEL light sources 12. It is shown by way of example that these VCSEL light sources are spaced apart by a distance q. Generally, the distances among the emitters may also differ in the two linearly independent directions defining the surface. As an example, FIG. 1 depicts an array of 3×5 VCSEL light sources 12. Generally, however, array 10 includes n×m VCSEL light sources 12, n and m being natural numbers.

Imaging optics 14 is used to generate imaging spots 18 on a printing form 16, adjacent imaging spots being spaced apart by a distance l. In this context, it is unimportant for the essence of the present invention whether distance l between adjacent imaging spots equals the distance of printing dots p to be set, or whether it is a distance l between adjacent imaging spots which is greater than the distance of printing dots p to be imaged. In this instance, a translation of the imaging spots relative to the printing form is carried out in order to record images using an interleaving method.

VCSEL light sources 12 of the array of light sources 10 are able to be controlled individually. To represent this, image-recording light sources 110 of individually controlled VCSEL light sources 12 are shown. The array of light sources 10 is accommodated on a supply unit 112. This supply unit 112 is in contact with a control unit 116 to exchange data and/or control signals 114. As already mentioned above, a device is provided for moving printing form 16 relative to imaging spots 18 of the array of light sources 10, in order to set printing dots on printing form 16. To densely fill a two-dimensional surface on printing form 16, provision is made for a movement in a first direction 118, as well as in a second direction 120, which define the surface of printing form 16.

In one especially advantageous embodiment of the present invention, the array of light sources 10 is extended in one dimension of the two-dimensional printing form, whether it be flat or at least partially curved, such that the entire format or side width, thus at least the width of the printing surface, in terms of imaging, on printing form 16, may essentially be imaged in parallel. There is then no need to move the device for recording images in this direction, so that an image recording may be carried out quickly and precisely.

Figure 2:
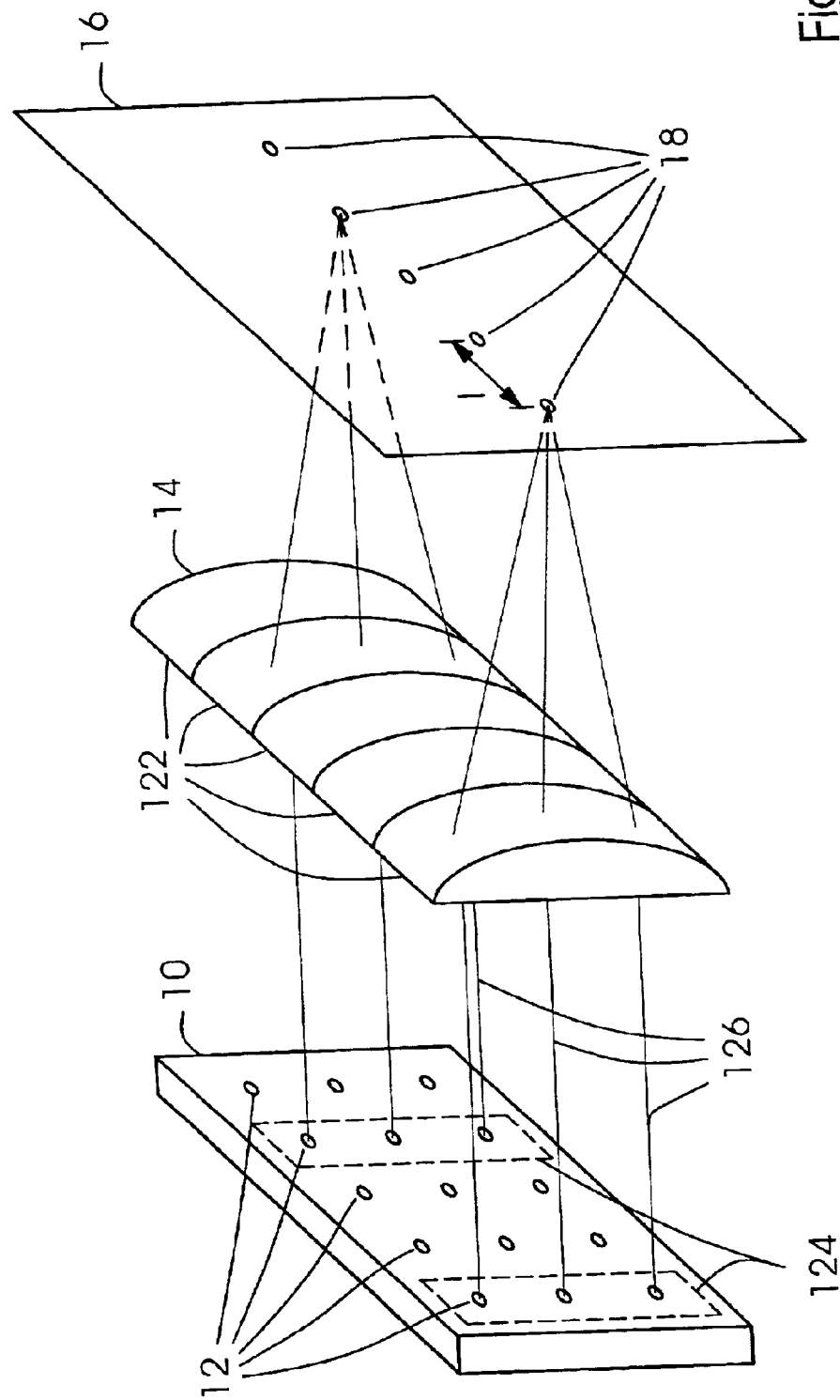
FIG. 2 shows a schematic representation of an advantageous specific embodiment of the device according to the present invention for recording images on a printing form, having an array of VCSEL light sources, which includes subarrays, and having an imaging optics, which includes individual components.

FIG. 2 is a schematic representation of an advantageous specific embodiment of the device according to the present invention for recording images on a printing form, having an array of VCSEL light sources, which includes subarrays, and having an imaging optics, which includes individual components. FIG. 2 depicts array of light sources 10, which includes individual VCSEL light sources 12, imaging optics 14, which includes individual components 122, and printing form 16. A subarray 124 constitutes a subset of the entire quantity of VCSEL light sources 12. Subarrays 124 are typically disjointed with respect to one another and together make up the entire quantity of VCSEL light sources 12. Illustrated in this FIG. 2 by way of example is an array of light sources 10 made up of 3×5 VCSEL light sources 12.

Generally, it is a question of array of light sources 10 of n×m VCSEL light sources 12, n and m being natural numbers. By way of example, a subarray 124 includes three VCSEL light sources of one column, thus of the three different rows. Imaging optics 14 is constructed of components 122 such that the light emitted from a subarray 124, here image-recording light beams 126 of the subarray, are converged into an imaging spot 18 on the printing form. In other words, VCSEL light sources 12 of a specific subarray 124 are the light sources of an image-recording channel for generating an imaging spot 18 on the printing form. In this connection, as already mentioned, it is unimportant whether distance l between adjacent imaging spots on the printing form is equal to or greater than the distance between adjacent imaging spots p. Subarrays 124 of the array of light sources 10 are preferably configured such that the light emitted by VCSEL light sources 12 of subarray 124 is converged into imaging spots 18 on printing form 16 which are essentially disposed in one line on the printing form. Thus, a group of imaging spots is formed, which, in order to generate raster scan lines, i.e., image-recording lines on printing form 16, are able to be moved over the same in the linearly independent directions defining the surface of printing form 16.

Figure 3:
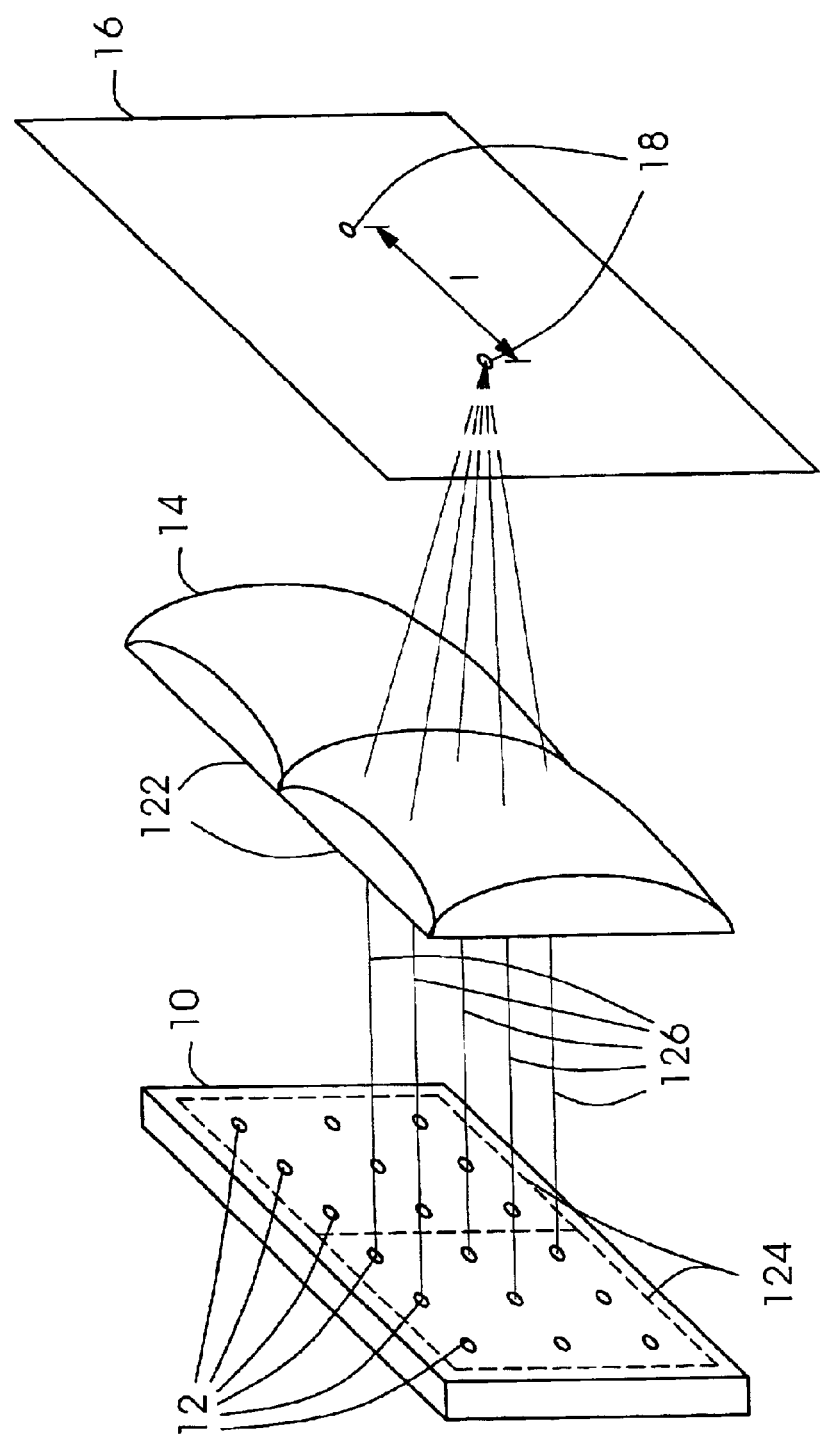
FIG. 3 shows a schematic representation of an alternative specific embodiment of the device according to the present invention for recording images on a printing form, having an array of VCSEL light sources, which includes subarrays, and having an imaging optics, which includes individual components.

FIG. 3 is a schematic representation of an alternative specific embodiment of the device according to the present invention for recording images on a printing form, having an array of VCSEL light sources, which includes subarrays, and having an imaging optics, which includes individual components. In this context, the device for recording images on a printing form includes array of light sources 10, having VCSEL light sources 12, imaging optics 14, which includes components 122, and printing form 16. Illustrated in FIG. 3 by way of example is an array of 3×6 VCSEL light sources 12. This array of light sources 10 has exemplarily two 3×3 subarrays 124. Imaging optics 14 is configured such that a component 122 concentrates image-recording beams 126 of subarray 124 in an imaging spot 18 on printing form 16.

In one advantageous further embodiment of the specific embodiments of the present invention in accordance with FIG. 2 or FIG. 3, at least one component 122 of imaging optics 14, which acts upon a subarray 124 of array 10 of VCSEL light sources 12, may also be designed as a microoptical component. In particular, it is especially advantageous when components 122 are movable relatively to one another.

Figure 4:
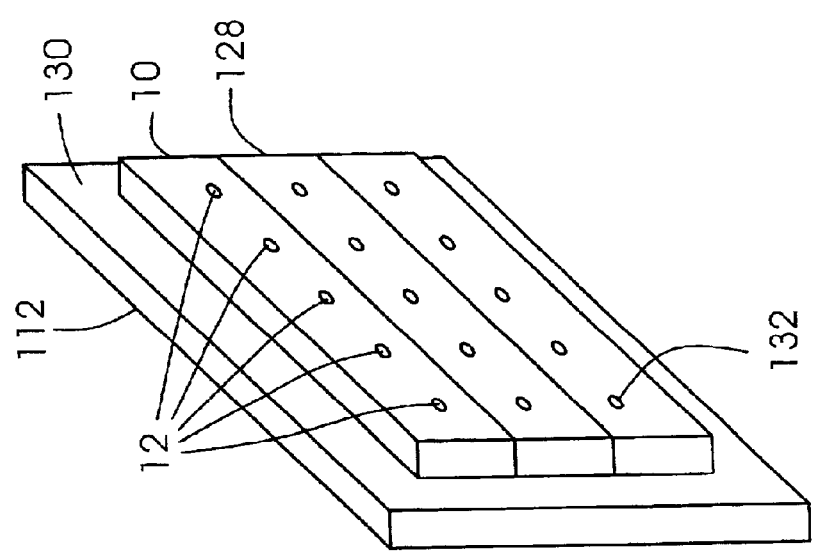
FIG. 4 shows a schematic representation of a specific embodiment having an array of VCSEL light sources, modularly assembled from subarrays, in the device according to the present invention for recording images on a printing form.

FIG. 4 shows a schematic representation of a specific embodiment having an array of VCSEL light sources, modularly assembled from subarrays, in the device according to the present invention for recording images on a printing form. The array of light sources 10 having VCSEL light sources 12 is made up here, by way of example, of three light source modules 128, which here, exemplarily, each have five VCSEL light sources 12 configured in a row. Light source modules 128 are arranged side-by-side in such a way that a 3×5 array of light sources 10 is formed. As mounting element 130, preferably a surface of supply unit 112 of the array of light sources 10 is used. A reference emitter 132 may be designated for a light source module 128. This reference emitter 132 is provided for diagnosing parameters relevant to emission. The parameters relevant to emission include, for example, the supply current or also, however, the power output from the VCSEL light source.

Figure 5:
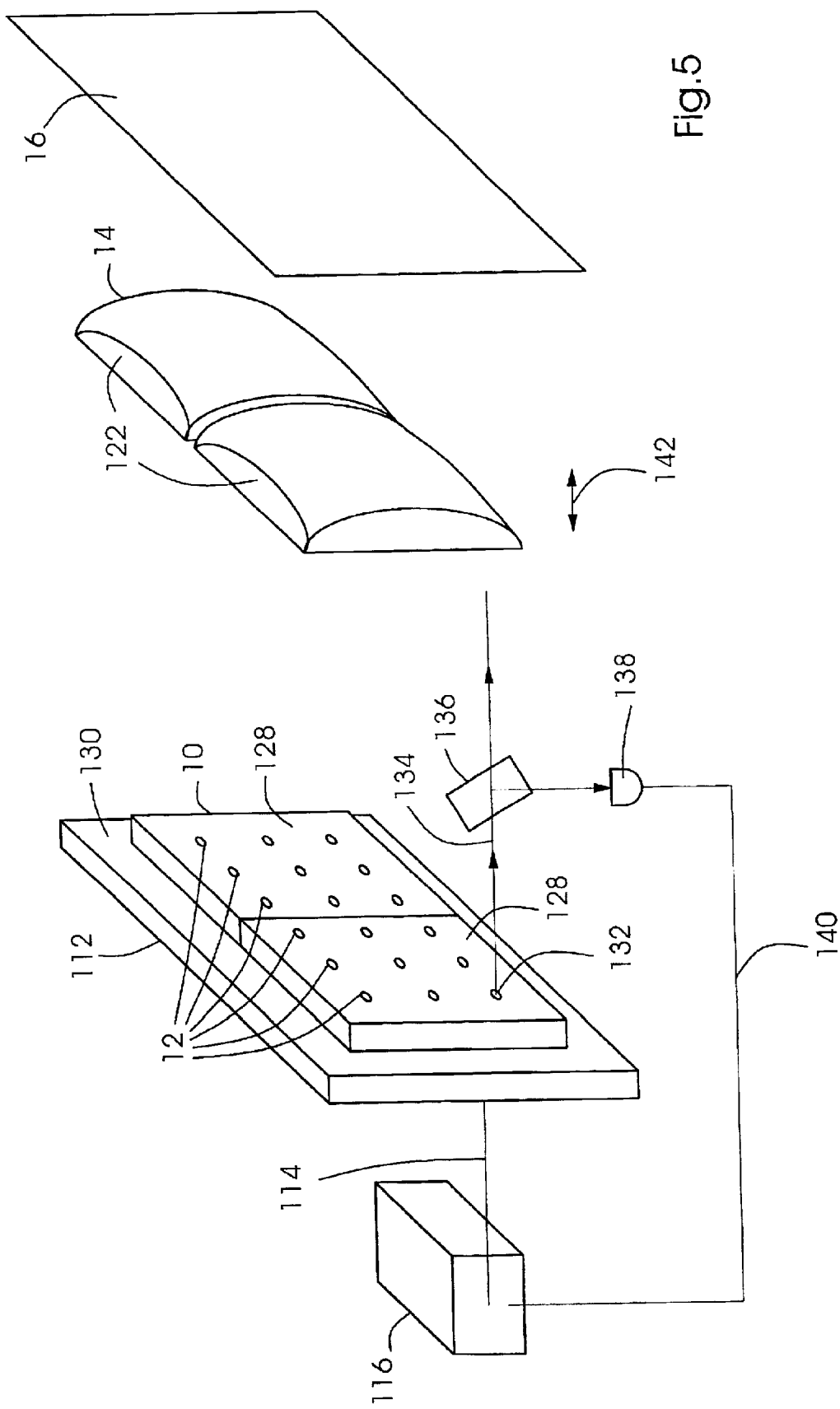
FIG. 5 shows a schematic representation of an alternative specific embodiment having an array of VCSEL light sources, modularly assembled from subarrays, in the device according to the present invention, together with a topology of a power-output detection of a reference emitter.

FIG. 5 is a schematic representation of an alternative specific embodiment having an array of VCSEL light sources, modularly assembled from subarrays, together with a topology of a power-output detection of a reference emitter. The device for recording images on a printing form includes an array of light sources 10, having VCSEL light sources 12, an imaging optics 14, which includes components 122, and a printing form 16. In this specific embodiment shown by way of example, 3×6 array 10 of VCSEL light sources 12 is composed of two light source modules 128. Light source modules 128 each have 3×3 VCSEL light sources 12. A surface of supply unit 112 is used as mounting element 130.

With the assistance of a connection for exchanging data and/or control signals 114, supply unit 112 is in contact with a control unit 116. A reference emitter 132 is provided on a light source module 128. It is shown here exemplarily that this reference emitter 132 emits an image-recording beam 134 for recording images on printing form 16. A known splitting ratio is applied by a beam splitter 136 to couple out a portion of the emitted light from image recording beam 134 and direct it to a detector 138. Via a connection 114, the signal from detector 138 attains control unit 116 for further processing. It is, thus, possible to implement a control process through which the input power of at least one VCSEL light source, here of reference emitter 132, is varied as a function of the power output from this light source when 10 the power output deviates from a setpoint value. Moreover, a reference emitter 132 of a subarray 128 of array 10 of VCSEL light sources 12 maybe used in a control in such a way that the input power of at least one further VCSEL light source 12 of subarray 128 is varied as a function of the power output from the reference emitter, when the power output deviates from a setpoint value.

In addition, it is particularly beneficial when at least one component 122 of imaging optics 14 for a subarray 128 of array 10 of VCSEL light sources is movable in a displacement direction 142 such that the position of the downstream focus is variable as a function of the distance of the array of VCSEL light sources 12 to printing form 16. In this connection, it is known to one skilled in the art that the value of a distance measurement between light sources 12 and printing form 16 may be used as an input parameter for an autofocus control, and this, in turn, may be used to advantageously further refine the device according to the present invention for recording images on a printing form.

Alternatively to the topology of a power-output detection shown in FIG. 5, it is likewise possible to measure the power output from at least one reference emitter 132 directly at VCSEL light source 12, at a resonator mirror.

FIG. 6 depicts the recording of images on a printing form that is located on a rotatable cylinder. Here, the array of light sources 20 having VCSEL light sources 21 generates, by way of example, three image-recording light beams 22, which are imaged using imaging optics 24 onto three imaging spots 210. The imaging spots are advantageously spaced apart at uniform distances and are disposed on one axis. Printing form 28 is situated on a cylinder 26, which is rotatable about its axis of symmetry 25. This rotation is illustrated by arrow B. The array of light sources 20 may be moved in parallel to axis of symmetry 25 of the cylinder on an essentially linear path, as denoted by double arrow A. For a continuous or pulsed image recording, cylinder 26 rotates with printing form 28 in accordance with rotary motion b, and the array of light sources 20 with supply unit 23 translates along the cylinder in accordance with moving direction A. The result is an image recording that encircles axis of symmetry 25 of cylinder 26 over a helical path 212. The path of imaging spots 210 is indicated by lines 212. In other words: Once the image recording of, in this case, three spots has taken place, there is a relative displacement of printing form 28 and of imaging spots 210, with a vector component that is normal to the direction defined by the line of the three imaging spots, by a first specific amount, so that at another location of printing form 28, three spots may be written once more. In this manner, so-called raster scan lines of imaging spots are formed. For every specific distance among adjacent raster scan lines, thus distance l among adjacent imaging spots and number of imaging spots, a second specific amount of a necessary displacement is derived in parallel to the axis defined by the line of the three imaging spots, so that a dense image recording results, i.e., the image recording of each designated printing dot on printing form 28.

Expressed differently, when light source array 20 is oriented such that n image-recording beams 22 are generated, whose axis is disposed essentially in parallel to translational direction A, then n imaging spots 210 move along n helices over cylinder 26 rotating in direction B. If one considers an azimuth angle, then n helices are interleaved. Viewed in the direction in parallel to rotational axis 25, at this azimuth angle, a deviation in the helices is necessary, in conformance with the feed rules of an interleaving raster-scan line method, in order to avoid covering spots on the surface of cylinder 26 twice, when imaging spots 210 generated by n helices are not densely situated.

The depicted device for recording images in accordance with FIG. 6 may be realized at a cylinder 26 in a print unit.

A print unit of this kind may constitute part of a printing press, for example as a substitute for the form cylinder in the printing press in U.S. Pat. No. 6,318,264, which is hereby incorporated by reference herein.

Reference Numeral List
10 light source array
12 VCSEL light source
14 imaging optics
16 printing form
18 imaging spot
110 image-recording light beam
112 supply unit
114 connection for exchanging data and/or control signals
116 control unit
118 first moving direction
120 second moving direction
122 component
124 subarray
126 image-recording light beam of the subarray
128 light source module
130 mounting element
132 reference emitter
134 image-recording beam of the reference emitter
136 beam splitter
138 detector
140 signal connection
142 displacement direction
20 light source array
21 VCSEL light source
22 image-recording light beam
23 supply unit
24 imaging optics
25 axis of rotation
26 cylinder
28 printing form
210 imaging spots
212 path of the imaging spots
q distance among emitters
l distance among adjacent imaging spots
p distance among printing dots
A translational direction
B rotational direction

What is claimed is:

1. A device for recording images on a printing form comprising:

an array of light sources;

imaging optics for generating n×m imaging spots on the printing form, n being greater than one and m being greater than or equal to one and n and m being natural numbers;

the array of light sources including an array of r×s VCSEL light sources, at least two of the r×s VCSEL light sources being controllable independently of one another, r being greater than or equal to n and s being greater than or equal to m, r and s being natural numbers;

wherein the array of r×s VCSEL light sources is constituted in modular form by a plurality of subarrays.

2. The device as recited in claim 1 the printing form has at least one specific imaging spot formed by combining light emitted by one of the subarrays of the r×s VCSEL light sources.

3. The device as recited in claim 2 wherein the subarray has at least one first and one second VCSEL light source, the first and second VCSEL light sources being controlled so that light emitted by the first VCSEL light source is in a fixed phase relation to light emitted by the second VCSEL light source.

4. The device as recited in claim 1 wherein the printing form has a row of n imaging spots with a distance 1 between adjacent spots.

5. The device as recited in claim 1 wherein the imaging optics includes at least one component acting on at least one subarray of the plurality of subarrays and being a microoptical component.

6. The device as recited in claim 1 wherein one of the subarrays has a VCSEL light source provided as a reference emitter for diagnosing parameters relevant to emission.

7. The device as recited in claim 1 wherein the imaging optics has a component with a focal position variable as a function of a distance at least one light source of the array of VCSEL light sources to the printing form.

8. The device as recited in claim 1 wherein the array of VCSEL light sources has at least one first light source having a control, the control, as a function of a power output from the first light source, varying an input power when the power output deviates from a setpoint value.

9. The device as recited in claim 8 wherein the at least one first light source is a reference emitter of one of the plurality of subarrays, the input power being the input power for at least one further light source of the one subarray when the power output deviates from a setpoint value.

10. The device as recited in claim 1 wherein at least one light source of the array of VCSEL light sources generates short pulsed radiation.

11. A printing-form imaging unit comprising:

at least one device for recording images on a printing form as recited in claim 1.

12. A print unit comprising:

at least one device for recording images on a printing form as recited in claim 1.

13. A printing press, comprising:

at least one feeder, a print unit as recited in claim 12, and a delivery unit.

14. A device for recording images on a printing form comprising:

an array of light sources;

imaging optics for generating n×m imaging spots on the printing form, n being greater than one and m being greater than or equal to one and n and m being natural numbers; the array of light sources including an array of r×s VCSEL light sources, at least two of the r×s VCSEL light sources being controllable independently of one another, r being greater than or equal to n and s being greater than or equal to m, r and s being natural numbers;

wherein the array of r×s VCSEL light sources includes a subarray of at least two of the VCSEL light source, the printing form having at least one specific imaging spot formed by combining light emitted by the subarray of the r×s VCSEL light sources; and wherein the subarray has at least one first and one second VCSEL light source, the first and second VCSEL light sources being controlled so that light emitted by the first VCSEL light source is in a fixed phase relation to light emitted by the second VCSEL light source.

15. A device for recording images on a printing form comprising:

an array of light sources;

imaging optics for generating n×m imaging spots on the printing form, n being greater than one and m being greater than or equal to one and n and m being natural numbers; the array of light sources including an array of r×s VCSEL light sources, at least two of the r×s VCSEL light sources being controllable independently of one another, r being greater than or equal to n and s being greater than or equal to m, r and s being natural numbers;

wherein the array of VCSEL light sources has at least one subarray, the subarray having a VCSEL light source provided as a reference emitter for diagnosing parameters relevant to emission.

16. A device for recording images on a printing form comprising:

an array of light sources;

imaging optics for generating n×m imaging spots on the printing form, n being greater than one and m being greater than or equal to one and n and m being natural numbers; the array of light sources including an array of r×s VCSEL light sources, at least two of the r×s VCSEL light sources being controllable independently of one another, r being greater than or equal to n and s being greater than or equal to m, r and s being natural numbers;

wherein the array of VCSEL light sources has a subarray, the imaging optics for the subarray having a component with a focal position variable as a function of a distance at least one light source of the array of VCSEL light sources to the printing form.

17. A device for recording images on a printing form comprising:

an array of light sources;

imaging optics for generating n×m imaging spots on the printing form, n being greater than one and m being greater than or equal to one and n and m being natural numbers; the array of light sources including an array of r×s VCSEL light sources, at least two of the r×s VCSEL light sources being controllable independently of one another, r being greater than or equal to n and s being greater than or equal to m, r and s being natural numbers;

wherein the array of VCSEL light sources has at least one first light source having a control, the control, as a function of a power output from the first light source, varying an input power when the power output deviates from a setpoint value.

18. The device as recited in claim 17 wherein the at least one first light source is a reference emitter of a subarray of the array of VCSEL light sources, the input power being the input power for at least one further light source of the subarray when the power output deviates from a setpoint value.

19. A device for recording images on a printing form comprising:

an array of light sources;

imaging optics for generating n×m imaging spots on the printing form, n being greater than one and m being greater than or equal to one and n and m being natural numbers; the array of light sources including an array of r×s VCSEL light sources, at least two of the r×s VCSEL light sources being controllable independently of one another, r being greater than or equal to n and s being greater than or equal to m, r and s being natural numbers;

wherein at least one light source of the array of VCSEL light sources generates short pulsed radiation.

* * * * *